(12) United States Patent
Chien

(10) Patent No.: US 11,137,674 B2
(45) Date of Patent: Oct. 5, 2021

(54) MASK ADOPTED TO MANUFACTURING PROCESS OF DISPLAY PANEL

(71) Applicants: HKC Corporation Limited, Shenzhen (CN); Chongqing HKC Optoelectronics Technology Co., Ltd., Chongqing (CN)

(72) Inventor: Chung-Kuang Chien, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

(*) Notice: Subject to any disclaimer, the term of this patent is extended or adjusted under 35 U.S.C. 154(b) by 315 days.

(21) Appl. No.: 16/344,024

(22) PCT Filed: Apr. 27, 2017

(86) PCT No.: PCT/CN2017/082108
§ 371 (c)(1),
(2) Date: Apr. 23, 2019

(87) PCT Pub. No.: WO2018/086316
PCT Pub. Date: May 17, 2018

(65) Prior Publication Data
US 2019/0339609 A1 Nov. 7, 2019

(30) Foreign Application Priority Data
Nov. 9, 2016 (CN) .......................... 201610988750.3

(51) Int. Cl.
| | | |
|---|---|---|
| *G03F 1/00* | (2012.01) | |
| *G03F 1/26* | (2012.01) | |
| *G02F 1/13* | (2006.01) | |
| *G02F 1/1335* | (2006.01) | |
| *G03F 1/50* | (2012.01) | |
| *G03F 7/00* | (2006.01) | |

(52) U.S. Cl.
CPC .............. *G03F 1/26* (2013.01); *G02F 1/1303* (2013.01); *G02F 1/133516* (2013.01); *G03F 1/00* (2013.01); *G03F 1/50* (2013.01); *G03F 7/0007* (2013.01)

(58) Field of Classification Search
CPC ..... G03F 1/00; G03F 1/54; G03F 1/50; G03F 7/0007; G02F 1/133514; G02F 1/133516; G02F 1/1303; G02B 5/223
USPC .............................................. 430/7; 349/106
See application file for complete search history.

(56) References Cited

U.S. PATENT DOCUMENTS

| | | | |
|---|---|---|---|
| 2001/0051305 A1 | 12/2001 | Lee | |
| 2018/0157100 A1* | 6/2018 | Yuan | ..................... G03F 7/0007 |

FOREIGN PATENT DOCUMENTS

| | | | |
|---|---|---|---|
| CN | 101438386 A | | 5/2009 |
| CN | 103592815 A | | 2/2014 |
| CN | 103744198 A | | 4/2014 |
| CN | 103760717 A | | 4/2014 |
| CN | 104614931 A | | 5/2015 |
| CN | 104965337 A | * | 10/2015 |
| CN | 105158962 A | | 12/2015 |
| CN | 106526948 A | | 3/2017 |

OTHER PUBLICATIONS

Meijuan Ma, the International Searching Authority written comments, dated Aug. 2017, CN.
Meijuan Ma, the International Search Report, dated Aug. 2017, CN.

* cited by examiner

*Primary Examiner* — John A McPherson

(57) ABSTRACT

The present application discloses a mask adapted to a manufacturing process of a display panel. The light filtering layer includes at least three light filtering portions for light rays with different wavelengths to pass through, the at least three light filtering portions have a one-to-one correspondence to color filter in the display panel, and each of the light filtering portions is only adapted to the light rays with the wavelength having the same color as one of the color filters to pass through. The first light shading layer includes a plurality of light shading blocks spacedly arranged, and one light shading block is arranged at both ends of each of the light filtering portions respectively. The carrier is configured in a light-transmission way, and the light filtering layer and the first light shading layer are disposed on the carrier.

18 Claims, 8 Drawing Sheets

MASK ADOPTED TO MANUFACTURING PROCESS OF DISPLAY PANEL

The present application claims priority to the Chinese Patent Application No. 2016109887503 filed to the Chinese Patent Office on Nov. 9, 2016, and entitled "MASK ADOPTED TO MANUFACTURING PROCESS OF DISPLAY PANEL", which is incorporated herein by reference in its entirety.

TECHNICAL FIELD

The present application relates to the technical field of displays, and in particular relates to a mask adapted to a manufacturing process of a display panel.

BACKGROUND

It should be understood that the statements in this section merely provide background information related to the present application and may not constitute prior art.

Liquid crystal displays have numerous advantages, such as a thin body, power saving, no radiation, etc., and are widely used. Most liquid crystal displays in the current market are backlit type liquid crystal displays, each including a liquid crystal panel and a backlight module. Working principle of the liquid crystal panel is that liquid crystals are put in two parallel glass substrates, and a driving voltage is adapted to two glass substrates to control rotational direction of the liquid crystals, to refract light rays of the backlight module to generate a picture.

Thin film transistor liquid crystal displays (TFT-LCD) currently maintain a leading status in the display field because of low power consumption, excellent picture quality, high production yield, and other properties. Similarly, the TFT-LCD includes a liquid crystal panel and a backlight module. The liquid crystal panel includes a color filter substrate (CF substrate), a thin film transistor substrate (TFT substrate) and a mask, and transparent electrodes on relative inner sides of the above substrates. A layer of liquid crystals (LC) is positioned between two substrates.

Existing masks generally have multiple categories, and are used for exposure and developing of the CF substrate in processing three primary colors: red, green and blue. Therefore, different masks need to be used to realize exposure after red, green and blue color filter are respectively coated. Three different masks need to be used three times in manufacturing the red, green and blue color filters. Therefore, different masks need to be replaced in using, thereby increasing the switching time of the manufacturing processes.

SUMMARY

The aim of the present application is to provide a mask adapted to a manufacturing process of a display panel, to shorten the switching time of the manufacturing process.

The aim of the present application is realized by the following technical solution.

According to one aspect of the present application, the present application discloses a mask adapted to a manufacturing process of a display panel. The mask includes: a light filtering layer including at least three light filtering portions for light rays with different wavelengths to pass through, where the at least three light filtering portions have a one-to-one correspondence to color filters in the display panel, and each of the light filtering portions is only used for the light rays with the wavelength having a same color as one of the color filters to pass through, a first light shading layer including a plurality of light shading blocks, the light shading blocks are spacedly arranged, and one light shading block is respectively arranged at both ends of the light filtering portions, and a carrier configured in a light transmission way, where the light filtering layer and the first light shading layer are disposed on the carrier.

Optionally, each of the light filtering portions includes a metal grating for light rays with a preset wavelength to pass through. The metal gratings filter the light rays with the preset wavelength, and only the light rays with the preset wavelength can pass through the metal gratings, so that light rays with other wavelengths are filtered out, thereby preventing the light rays with other wavelengths from passing through.

Optionally, each of the light filtering portions includes a transparent medium for light rays with a preset wavelength to pass through. The transparent media enable the light rays with the preset wavelength to pass through or enable light with a wavelength having the same color as the light rays with the preset wavelength to transmit. The transparent media absorb light rays with other wavelengths, preventing the light rays with other wavelengths from passing through, or absorb light with other color wavelengths, preventing the light with other color wavelengths from transmitting.

Optionally, each of the light filtering portions includes a metal grating and a transparent medium used for light rays with a preset wavelength to pass through, and the metal gratings are stacked on the transparent media. The metal gratings filter the light rays with the preset wavelength, and only the light rays with the preset wavelength can pass through the metal gratings, so that light rays with other wavelengths are filtered out, to prevent the light rays with other wavelengths from passing through. The transparent media enable the light rays with preset wavelength to pass through or enable light with a wavelength having the same color as the light rays with preset wavelength to transmit. The transparent media absorb light rays with other wavelengths, preventing the light rays with other wavelengths from passing through, or absorb light with other color wavelengths, preventing the light with other color wavelengths from transmitting. Herein, the metal gratings are stacked on the transparent media, to ensure that red, green and blue light-transmission areas can be completely overlapped, so that the metal gratings and the transparent media can achieve combined action, the metal gratings realize filtration, and the transparent media realize absorption, and therefore, the light filtering effect is better.

Optionally, each of the light filtering portions includes a metal grating and a transparent medium used for light rays with a preset wavelength to pass through, and the transparent media are stacked on the metal gratings.

Optionally, the light filtering layer is directly disposed on the carrier, and the first light shading layer is directly disposed on the light filtering layer. This is a specific manner of configuring all the layers of the mask, the carrier plays a bearing role, and the first light shading layer is directly on the light filtering layer, so that the light shading effect of the first light shading layer is better.

Optionally, the light filtering layer is directly disposed on the carrier, the first light shading layer is directly disposed on the carrier, and the at least three light filtering portions are spacedly arranged among the plurality of light shading blocks. This is another manner of configuring all the layers of the mask, and due to the arrangement, the occupying space of the light filtering layer can be saved, and the material of the light filtering layer is saved.

Optionally, filling color filter are also arranged among the plurality of light shading blocks, have the same color as the corresponding color filter and are directly disposed on the light filtering portions. In the present application, the filling color filter (red/green/blue color filters) having a same photo-initiator as the color filter (such as red/green/blue color filters) in a CF substrate are matched on the mask, so that the light filtering effect is better.

Optionally, the carrier includes a light-transmission glass substrate. The glass substrate plays a supporting role and bears the first light shading layer and a filtering layer, and the light-transmission effect of the light-transmission glass substrate is good. In addition, the glass substrate in the mask of the present application may adopt quartz glass. Therefore, materials can be obtained simply and conveniently.

Optionally, the carrier includes a metal film, and through holes used for light transmission are arranged in the metal film. The metal film plays a supporting role and bears the first light shading layer and the filtering layer, and the metal film has high strength and good bearing. In addition, the through holes are arranged in the metal film to facilitate light transmission.

Optionally, the light filtering layer includes a red light filtering portion only for light rays with a red wavelength to pass through, a green light filtering portion only for light rays with a green wavelength to pass through, and a blue light filtering portion only for light rays with a blue wavelength to pass through; four light shading blocks are arranged, where the red light filtering portion, the green light filtering portion and the blue light filtering portion are spacedly arranged among the four light shading blocks. This is a specific light filtering structure of the light filtering layer of the present application, so that the mask of the present application can be directly adapted to a manufacturing process of the CF substrate of the display panel.

Optionally, the light filtering layer includes a red light filtering portion only for light rays with a red wavelength to pass through, a green light filtering portion only for light rays with a green wavelength to pass through, a blue light filtering portion only for light rays with a blue wavelength to pass through, and a white light filtering portion only for light rays with a white wavelength to pass through; five light shading blocks are arranged, where the red light filtering portion, the green light filtering portion, the blue light filtering portion and the white light filtering portion are spacedly arranged among the five light shading blocks.

Optionally, the light filtering layer includes a red light filtering portion only for light rays with a red wavelength to pass through, a green light filtering portion only for light rays with a green wavelength to pass through, a blue light filtering portion only for light rays with a blue wavelength to pass through, and a yellow light filtering portion only for light rays with a yellow wavelength to pass through; five light shading blocks are arranged, where the red light filtering portion, the green light filtering portion, the blue light filtering portion and the yellow light filtering portion are spacedly arranged among the five light shading blocks.

Optionally, the red light filtering portion includes a red transparent medium, the green light filtering portion includes a green transparent medium, and the blue light filtering portion includes a blue transparent medium.

Optionally, the red light filtering portion includes a red metal grating, the green light filtering portion includes a green metal grating, and the blue light filtering portion includes a blue metal grating.

Optionally, a red light filtering region, a green light filtering region and a blue light filtering region are formed between the four light shielding blocks; the red light filtering region is further provided with a red filling color filter, the red light filtering is located between the carrier and the red filling color filter; the green light filtering region is further provided with a green filling color filter, the green light filtering being located between the carrier and the green filling color filter; the blue light filtering region is also provided with a blue filling color filter, the blue light filtering being located between the carrier and the blue filling color filter.

Relative to the exemplary technique, three different masks need to be adapted to manufacturing processes of the three primary colors: red/green/blue. Therefore, different masks need to be replaced in a using process, thereby increasing the switching time of the manufacturing process.

The present application discloses a mask adapted to a manufacturing process of a display panel, including: a light filtering layer including at least three light filtering portions for light rays with different wavelengths to pass through, where the at least three light filtering portions have a one-to-one correspondence to color filters in the display panel, and each of the light filtering portions is only used for the light rays with the wavelength having a same color as one of the color filters to pass through, an first light shading layer including a plurality of light shading blocks, the light shading blocks are spacedly arranged, and one light shading block is arranged at both ends of the light filtering portions respectively: a carrier; that is light-transmission, where the light filtering layer and the first light shading layer are disposed on the carrier;

the manufacturing process of a display panel, including steps of:

forming the red color filter, where the light rays with the red wavelength pass through the red light filtering portion when the light rays with the red wavelength irradiate to the mask, the first light shading layer blocks the light rays with the red wavelength, and the green light filtering portion and the blue light filtering portion block the light rays with the red wavelength;

forming the green color filter, where the light rays with the green wavelength pass through the green light filtering portion when the light rays with the green wavelength irradiate to the mask, the first light shading layer blocks the light rays with the green wavelength, and the red light filtering portion and the blue light filtering portion block the light rays with the green wavelength;

forming the blue color filter, where the light rays with the blue wavelength pass through the blue light filtering portion when the light rays with the blue wavelength irradiate to the mask, the first light shading layer blocks the light rays with the blue wavelength, and the red light filtering portion and the green light filtering portion block the light rays with the blue wavelength.

The mask of the present application includes the first light shading layer, the plurality of light shading blocks on the first light shading layer respectively correspond to a second light shading layer (i.e. a BM (Basement Membrane) layer in the CF substrate) in the CF substrate when light rays irradiate, so that the light filtering layer in the mask of the present application corresponds to the color filter on the CF substrate, and specifically, the at least three light filtering portions respectively correspond to the three color filter on the CF substrate. Therefore, one light filtering portion corresponds to one color filter, the light rays with the wavelength having the same color as the color filter can pass through the light filtering portion, and the light rays with other wavelengths cannot pass through the light filtering portion when the light rays irradiate. For example, the at least three light filtering portions include the red light filtering portion, the green light filtering portion and the blue light filtering portion which respectively correspond to a red color filter, a green color filter and a blue color filter on the CF substrate. Further, the red light filtering portion is only used for the light rays with the red wavelength to pass through, the green light filtering portion is only used for the light rays with the green wavelength to pass through, and the blue light filtering portion is only used for the light rays with the blue wavelength to pass through. Therefore, the first light shading layer plays a light shading role, and the light rays with the red wavelength can pass through the red light filtering portion and cannot pass through the green light filtering portion and the blue light filtering portion when the light rays with the red wavelength irradiate on the mask of the present application, to achieve a manufacturing process of the red color filter. Similarly, the first light shading layer plays a light shading role, and the light rays with the green wavelength can pass through the green light filtering portion and cannot pass through the red light filtering portion and the blue light filtering portion when the light rays with the green wavelength irradiate on the mask of the present application, to achieve a manufacturing process of the green color filter. The first light shading layer plays a light shading role, and the light rays with the blue wavelength can pass through the blue light filtering portion and cannot pass through the red light filtering portion and the green light filtering portion when the light rays with the blue wavelength irradiate on the mask of the present application, to achieve a manufacturing process of the blue color filter. Therefore, in the present application, only one mask of the present application may be adapted to the manufacturing processes of the red/green/blue color filter of the display panel, to realize sharing of the mask of the present application. Compared with the prior art that a plurality of different masks needs to be used for the manufacturing processes of the red/green/blue color filters, the present application not only saves the material and the masks quantity, but also has no need to replace different masks, thereby greatly shortening the switching time of the manufacturing processes.

BRIEF DESCRIPTION OF DRAWINGS

The accompanying drawings are included to provide an understanding of the embodiments of the present application, constitute part of the description, and are used to illustrate implementation manners of the present application, and interpreting principles of the present application together with text description. Apparently, the drawings in the following description are merely some embodiments of the present application, and for those ordinary skilled in the art, other drawings can also be obtained according to the drawings without contributing creative labor. In the drawings.

DETAILED DESCRIPTION

Figure 1:
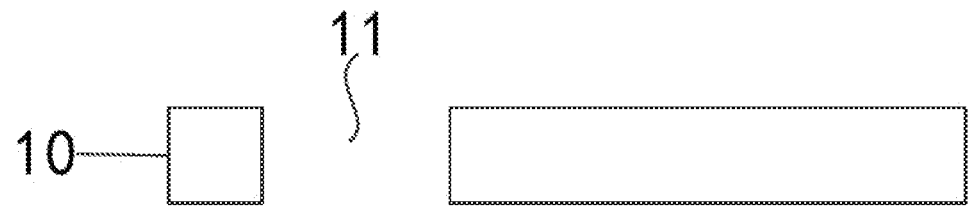
FIG. 1 is a structural schematic diagram of a mask.

Specific structure and function details disclosed herein are only representative and are used for the purpose of describing exemplary embodiments of the present application. However, the present application may be specifically achieved in many alternative forms and shall not be interpreted to be only limited to the embodiments described herein.

It should be understood in the description of the present application that terms such as "central", "horizontal", "upper", "lower", "left", "right", "vertical", "horizontal", "top", "bottom", "inner", "outer", etc. indicate direction or position relationships shown based on the drawings, and are only intended to facilitate the description of the present application and the simplification of the description rather than to indicate or imply that the indicated device or element must have a specific direction or constructed and operated in a specific direction, and therefore, shall not be understood as a limitation to the present application. In addition, the terms such as "first" and "second" are only used for the purpose of description, rather than being understood to indicate or imply relative importance or hint the number of indicated technical features. Thus, the feature limited by "first" and "second" can explicitly or impliedly include one or more features. In the description of the present application, the meaning of "a plurality of" is two or more unless otherwise specified. In addition, the term "comprise" and any variant are intended to cover non-exclusive inclusion.

It should be noted in the description of the present application that, unless otherwise specifically regulated and defined, terms such as "installation," "bonded," and "bonding" shall be understood in broad sense, and for example, may refer to fixed bonding or detachable bonding or integral bonding; may refer to mechanical bonding or electrical bonding; and may refer to direct bonding or indirect bonding through an intermediate medium or inner communication of two elements. For those of ordinary skill in the art, the meanings of the above terms in the present application may be understood according to concrete conditions.

The terms used herein are intended to merely describe concrete embodiments, not to limit the exemplary embodiments. Unless otherwise noted clearly in the context, singular forms "one" and "single" used herein are also intended to comprise plurals. It should also be understood that the terms "comprise" and/or "include" used herein specify the existence of stated features, integers, steps, operation, units and/or assemblies, not excluding the existence or addition of one or more other features, integers, steps, operation, units, assemblies and/or combinations of these.

The present application will be described in detail below with reference to the accompanying drawings and optional embodiments.

Masks of embodiments of the present application are described below with reference to FIGS. 4-10.

The masks are used for exposure and developing of a CF substrate in processing three primary colors: red/green/blue.

Figure 2:
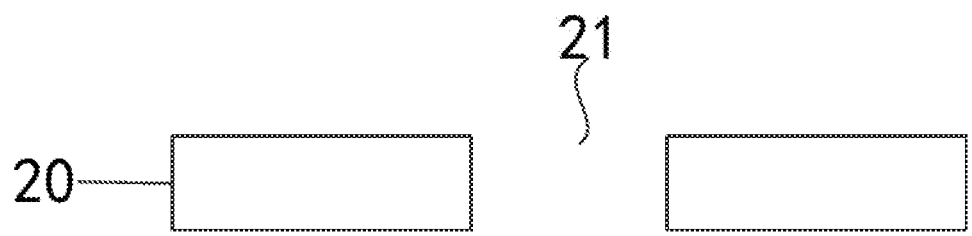
FIG. 2 is a structural schematic diagram of a mask.
Figure 3:
FIG. 3 is a structural schematic diagram of a mask.

Therefore, different masks need to be used for realizing exposure after red/green/blue color filter are respectively coated. Masks designed by the applicant are shown in FIGS. 1-3. Specifically, FIG. 1 shows a mask used for exposure of a red color filter, the mask is called an R-mask 10 herein, a light-transmission hole corresponding to the position of the red color filter is arranged in the R-mask 10, and the light-transmission hole is herein called an R-light-transmission hole 11. FIG. 2 shows a mask used for exposure of a green color filter, the mask is called a G-mask 20 herein, a light-transmission hole corresponding to the position of the green color filter is arranged in the G-mask 20, and the light-transmission hole is herein called a G-light-transmission hole 21. FIG. 3 shows a mask used for exposure of a blue color filter, the mask is called a B-mask 30 herein, a light-transmission hole corresponding to the position of the blue color filter is arranged in the B-mask 30, and the light-transmission hole is herein called a B-light-transmission hole 31. However, the applicant needs to use three different masks three times in the manufacturing processes of the red/green/blue color filters. Therefore, different masks need to be replaced in using, thereby increasing the switching time of the manufacturing processes.

As shown in FIGS. 4-10, embodiments of the present application disclose a mask adapted to a display panel, where the mask of the present embodiment is adapted to an LC panel. The present embodiment is described by an example that the mask is adapted to the LC panel. However, it should be noted that, the mask in the present embodiment is not limited thereto and is adapted to other display panels. For example, the mask in the present embodiment is adapted to an organic light-emitting diode (OLED) panel.

Specifically, a mask 100 includes: a light filtering layer 120 including at least three light filtering portions for light rays with different wavelengths to pass through, where the at least three light filtering portions have a one-to-one correspondence to color filters in the display panel, and each of the light filtering portions is only used for the light rays with the wavelength having the same color as one of the color filter to pass through, a first light shading layer 130 including a plurality of light shading blocks 131, where the light shading blocks 131 are spacedly arranged, and one light shading block is arranged at both ends of the light filtering portions respectively, and a carrier 110 configured in a light-transmission way, where the light filtering layer 120 and the first light shading layer 130 are disposed on the carrier 110.

In one or more embodiment, each of the light filtering portions includes a metal grating or/and a transparent medium for light rays with a preset wavelength to pass through. The metal gratings and the transparent media are stacked, and the metal gratings are stacked on the transparent media when each of the light filtering portions includes the metal grating and the transparent medium.

The mask of the one or more embodiment is described by an example that the mask is adapted to manufacturing processes of the color filter of the display panel, and it should be noted that, the mask of the present embodiment is not limited thereto.

The light rays with the preset wavelength in the present embodiment are mainly described by taking light rays with a red wavelength, light rays with a green wavelength and light rays with a blue wavelength as examples. Specifically, the light rays with the preset wavelength in the present embodiment are described by taking the light rays with the red wavelength, the light rays with the green wavelength and the light rays with the blue wavelength in the LC panel as examples. It should be noted that, the present embodiment is not limited to a traditional red/green/blue (RGB) LC panel, and the mask can also be adapted to manufacturing processes of other LC panels, such as a white, red, green and blue (WRGB) LC panel and a red, green, blue and yellow (RGBY) LC panel. Corresponding to the WRGB LC panel, the light filtering portions of the mask include four light filtering portions: a white light filtering portion, a red light filtering portion, a green light filtering portion and a blue light filtering portion respectively for light rays with a white wavelength, the light rays with the red wavelength, the light rays with the green wavelength and the light rays with the blue wavelength to pass through, and five light shading blocks. The red light filtering portion, the green light filtering portion, the blue light filtering portion and the white light filtering portion are spacedly arranged among the five light shading blocks. Corresponding to the RGBY LC panel, the light filtering portions of the mask include four light filtering portions: a yellow light filtering portion, a red light filtering portion, a green light filtering portion and a blue light filtering portion respectively for light rays with a yellow wavelength, the light rays with the red wavelength, the light rays with the green wavelength and the light rays with the blue wavelength to pass through, and five light shading blocks. The red light filtering portion, the green light filtering portion, the blue light filtering portion and the yellow light filtering portion are spacedly arranged among the five light shading blocks.

Figure 4:
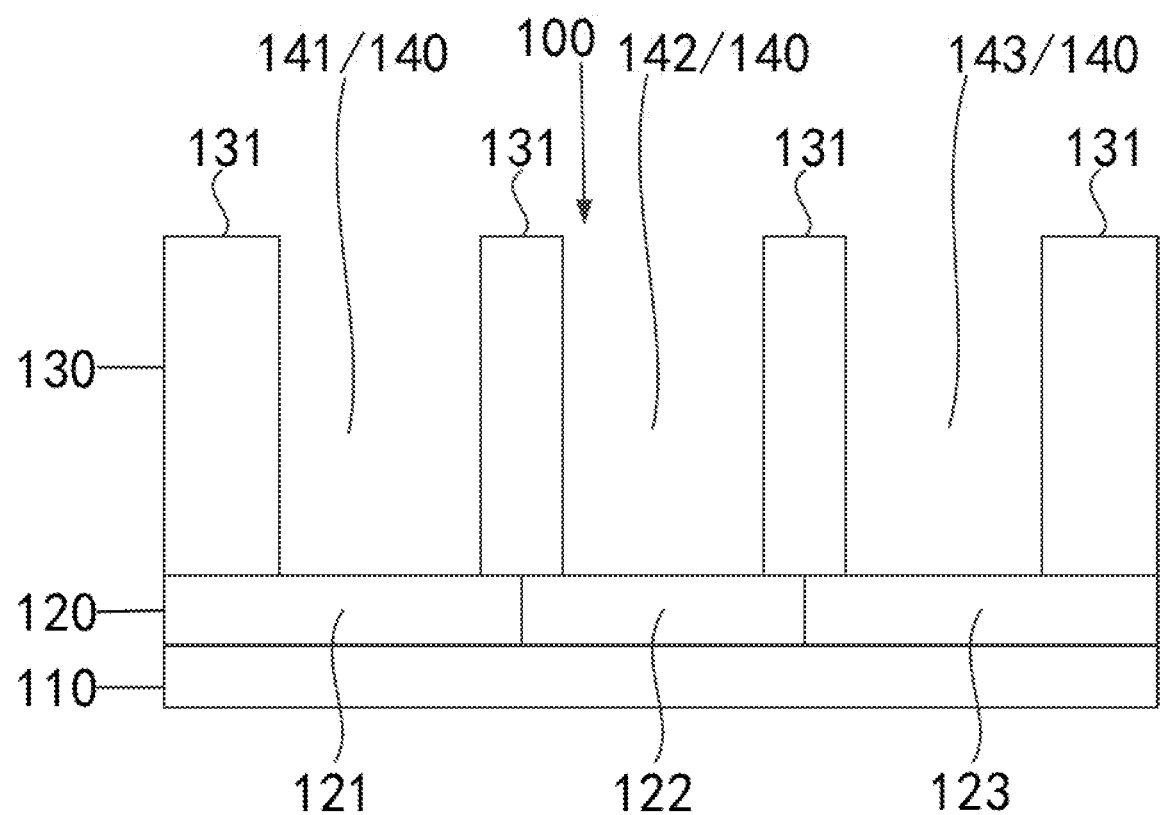
FIG. 4 is a structural schematic diagram of a mask of an embodiment of the present application.

Specifically, as an optional manner of embodiment, as shown in FIG. 4, the light filtering layer 120 is directly disposed on the carrier 110 and includes a red light filtering portion 121 only for light rays with a red wavelength to pass through, a green light filtering portion 122 only for light rays with a green wavelength to pass through, and a blue light filtering portion 123 only for light rays with a blue wavelength to pass through. The light filtering portions in the present embodiment are described in detail by taking the three light filtering portions of the red light filtering portion, the green light filtering portion and the blue light filtering portion as examples. However, it should be noted that, the light filtering portions in the present embodiment are not limited thereto, and other light filtering portions can also exist. The first light shading layer 130 is directly disposed on the light filtering layer 120, namely, the light filtering layer 120 is positioned between the carrier 110 and the first light shading layer 130. The first light shading layer 130 includes four light shading blocks 131 spacedly arranged, and three light filtering areas 140 are formed among the four light shading blocks 131 and include a red light filtering area 141, a green light filtering area 142 and a blue light filtering area 143. Therefore, two light shading blocks are respectively arranged at both ends of the light filtering portions to realize light shading.

A manufacturing process of the display panel includes a manufacturing process of the CF substrate. In the present embodiment, the first light shading layer 130 corresponds to a second light shading layer on the CF substrate, the red light filtering area corresponds to a red color filter of the CF substrate, the green light filtering area corresponds to a green color filter of the CF substrate, and the blue light filtering area corresponds to a blue color filter of the CF substrate. The red light filtering portion 121 is arranged at the red light filtering area 141, the green light filtering portion 122 is arranged at the green light filtering area 142, and the blue light filtering portion 123 is arranged at the blue light filtering area 143.

Figure 10:
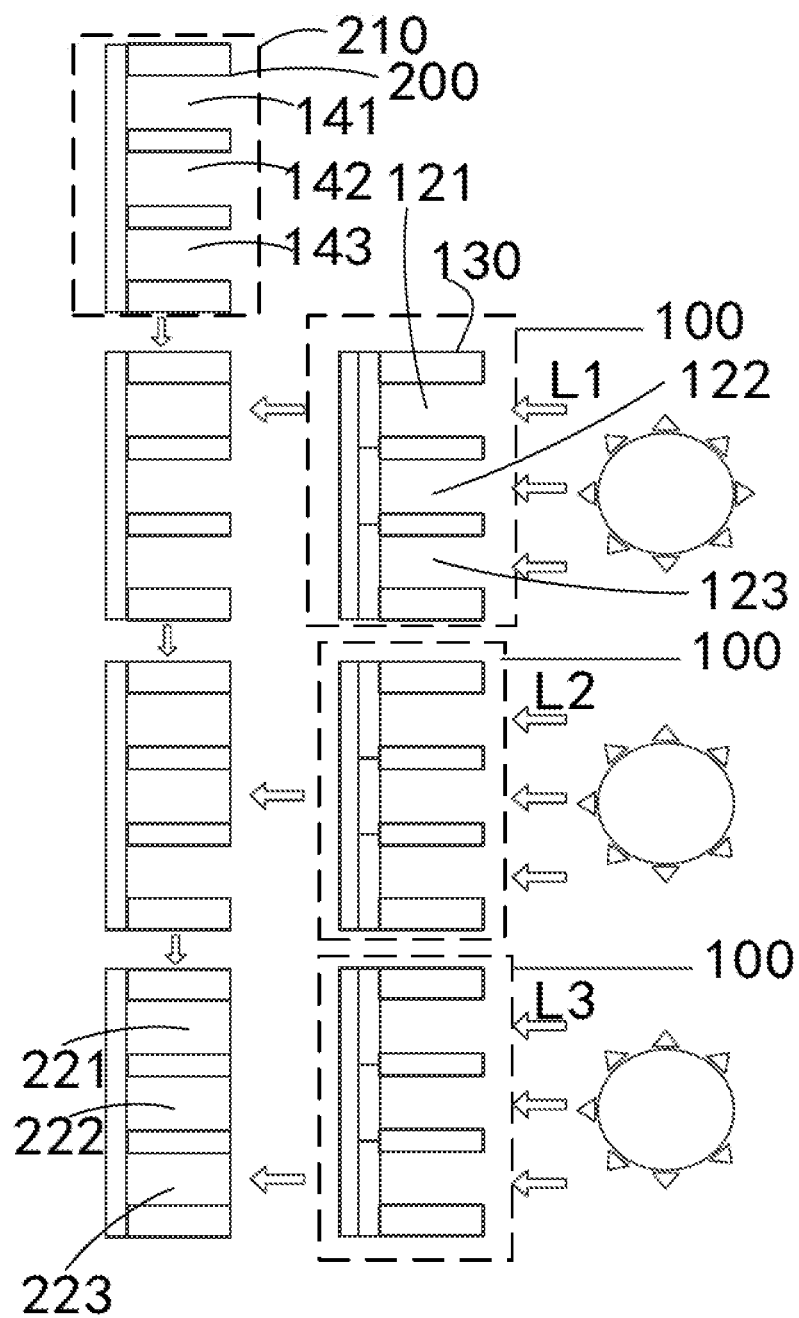
FIG. 10 is a schematic diagram of manufacturing processes of red/green/blue by a mask of an embodiment of the present application.

In one or more embodiment, when light rays irradiate, as shown in FIG. 10, FIG. 10 shows a schematic diagram of manufacturing processes of red/green/blue in the CF substrate by the mask of the present embodiment, where in the FIG. 10, a circle at the right side shows a light source, the middle portion is a same structure or the used same mask 100, and the manufacturing processes or the technologies of red/green/glue color filter of the CF substrate are shown at the left side from top to bottom. Specifically, the four light shading blocks 131 on the first light shading layer 130 respectively correspond to the second light shading layer 200, so that the red light filtering portion 121, the green light filtering portion 122 and the blue light filtering portion 123 in the mask 100 in the present embodiment respectively correspond to the red light filtering area 141, the green light filtering area 142 and the blue light filtering area 143 on the CF substrate. The red light filtering portion 121 is only used for the light rays with the red wavelength L1 to pass through, the green light filtering portion 122 is only used for the light rays with the green wavelength L2 to pass through, the blue light filtering portion 123 is only used for the light rays with the blue wavelength L3 to pass through, therefore, the first light shading layer 130 plays a light shading role, and the light rays with the red wavelength L1 can pass through the red light filtering portion 121 (with reference to a direction of an arrow in FIG. 10) and cannot pass through the green light filtering portion 122 and the blue light filtering portion 123 when the light rays with the red wavelength irradiate on the mask 100 in the present application, to achieve the manufacturing process of the red color filter 221. Similarly, the first light shading layer plays a light shading role, and the light rays with the green wavelength L2 can pass through the green light filtering portion 122 (with reference to a direction of an arrow in FIG. 10) and cannot pass through the red light filtering portion and the blue light filtering portion when the light rays with the green wavelength irradiate on the mask 100 in the present application, to achieve the manufacturing process of the green color filter 222. The first light shading layer plays a light shading role, and the light rays with the blue wavelength L3 can pass through the blue light filtering portion 123 (with reference to a direction of an arrow in FIG. 10) and cannot pass through the red light filtering portion and the green light filtering portion when the light rays with the blue wavelength irradiate on the mask 100 in the present application, to achieve the manufacturing process of the blue color filter 223. Therefore, in the present application, only one mask 100 in the present application may be adapted to the manufacturing processes of the red/green/blue color filter of the display panel, to realize sharing of the mask 100 in the present application. Compared with the prior art that a plurality of different masks need to be used for the manufacturing processes of the red/green/blue color filters, the present application not only saves the material and the masks quantity, but also has no need to replace different masks, thereby greatly shortening the switching time of the manufacturing processes.

The red light filtering portion includes a red metal grating or/and a red transparent medium, the red metal grating is used to filter the light rays with the wavelengths except for the red wavelength, to prevent the light rays with the wavelengths except for the red wavelength from passing through, and the red transparent medium is used to absorb the light rays with the wavelengths except for the red wavelength, to prevent the light rays with the wavelengths except for the red wavelength from passing through.

The green light filtering portion includes a green metal grating or/and a green transparent medium, the green metal grating is used for filtering the light rays with the wavelengths except for the green wavelength, to prevent the light rays with the wavelengths except for the green wavelength from passing through, and the green transparent medium is used for absorbing the light rays with the wavelengths except for the green wavelength, to prevent the light rays with the wavelengths except for the green wavelength from passing through.

The blue light filtering portion includes a blue metal grating or/and a blue transparent medium, the blue metal grating is used to filter the light rays with the wavelengths except for the blue wavelength, to prevent the light rays with the wavelengths except for the blue wavelength from passing through, and the blue transparent medium is used to absorb the light rays with the wavelengths except for the blue wavelength, to prevent the light rays with the wavelengths except for the blue wavelength from passing through.

Figure 5:
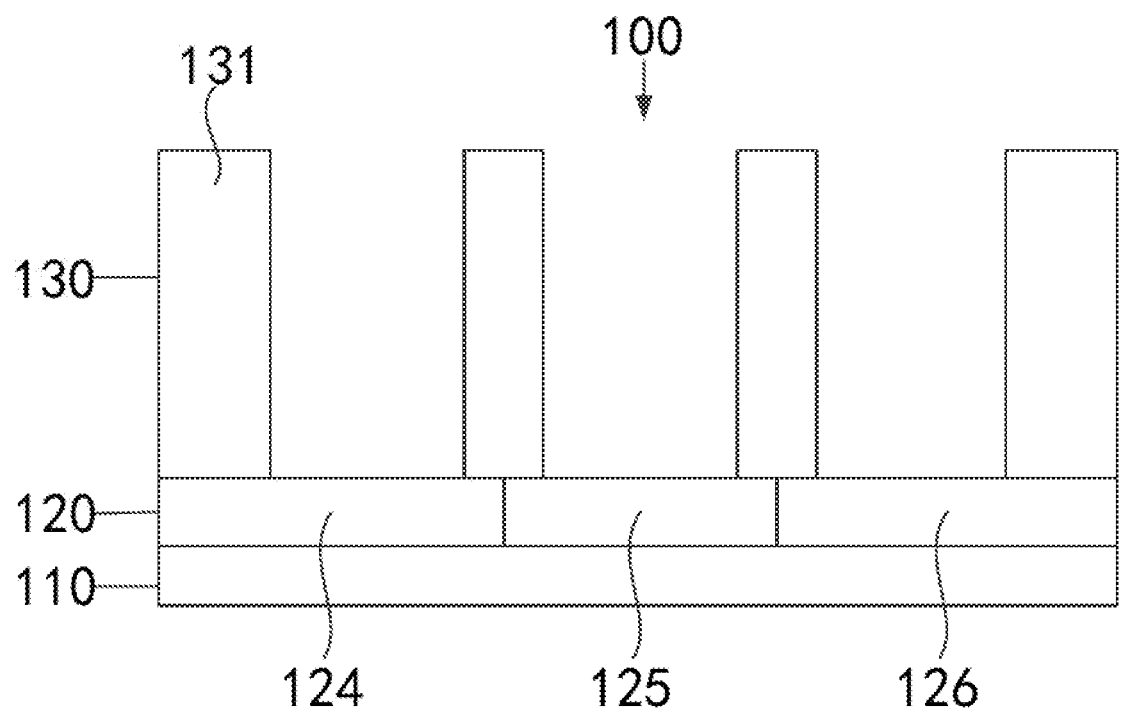
FIG. 5 is a structural schematic diagram of a mask of an embodiment of the present application.
Figure 6:
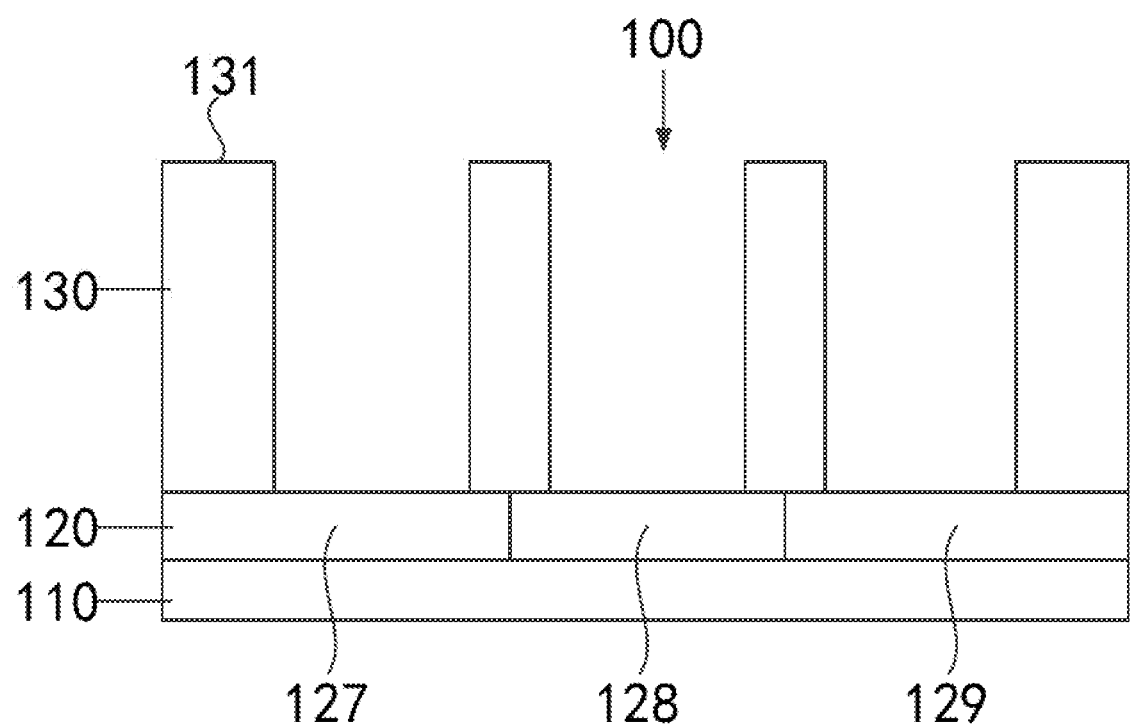
FIG. 6 is a structural schematic diagram of a mask of an embodiment of the present application.
Figure 9:
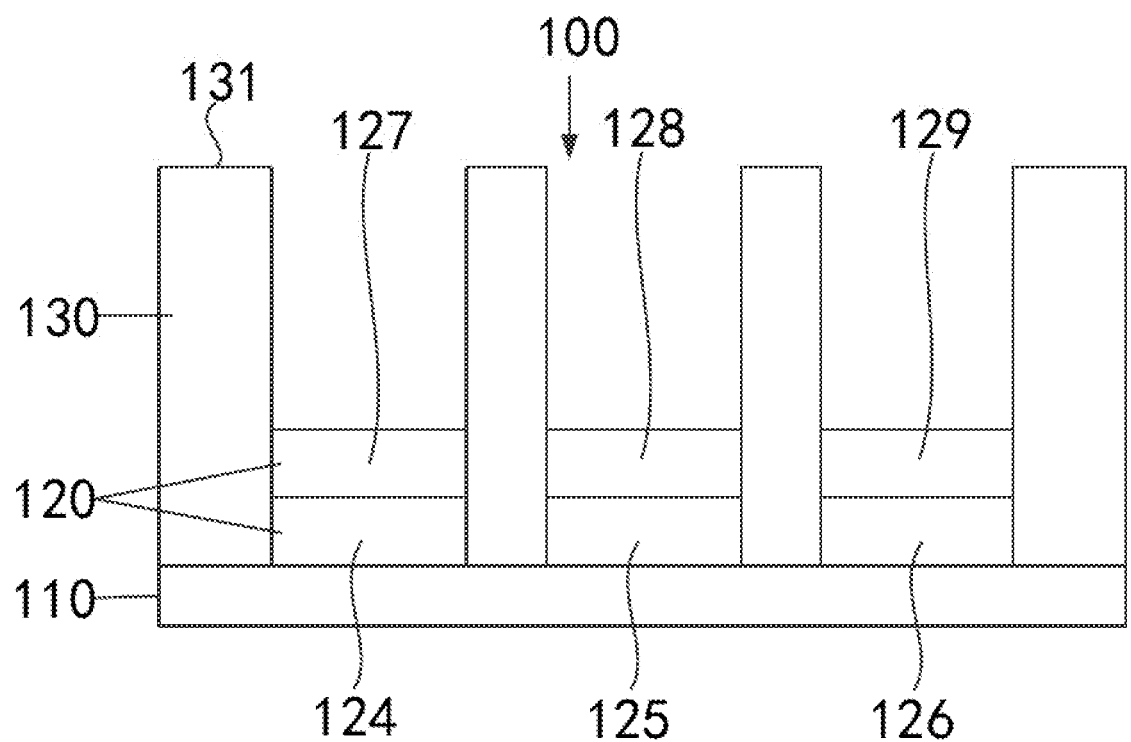
FIG. 9 is a structural schematic diagram of a mask of an embodiment of the present application.

As shown in FIG. 6, alternative manner of configuring the light filtering portions in the present embodiment is described as follows: the red light filtering portion 121 includes a red transparent medium 127, the green light filtering portion 122 includes a green transparent medium 128, and the blue light filtering portion 123 includes a blue transparent medium 129. As shown in FIG. 5, another optional manner of the present embodiment is described as follows: the red light filtering portion 121 includes a red metal grating 124, the green light filtering portion 122 includes a green metal grating 125, and the blue light filtering portion 123 includes a blue metal grating 126. However, it should be noted that, the red light filtering portion 121, the green light filtering portion 122 and the blue light filtering portion 123 in the present embodiment can adopt different metal gratings and different transparent media. For example, the red light filtering portion 121 includes the red transparent medium 127, the green light filtering portion 122 includes the green metal grating 125, and the blue light filtering portion 123 includes the blue metal grating 126. In addition, as shown in FIG. 9, the red light filtering portion 121 in the present embodiment includes a red metal grating and a red transparent medium, the green light filtering portion 122 includes a green metal grating and a green transparent medium, the blue light filtering portion 123 includes a blue metal grating and a blue transparent medium, the red metal grating and the red transparent medium are stacked, the green metal grating and the green transparent medium are stacked, and the blue metal grating and the blue transparent medium are stacked. Therefore, the metal gratings and the transparent media can achieve combined action, so that the light filtering effect is better.

The carrier 110 includes a transparent glass substrate, namely, the carrier directly uses the glass substrate for supporting, the glass substrate plays a supporting role and bears the first light shading layer and a filtering layer, and the light-transmission effect of the transparent glass substrate is good. In addition, the glass substrate in the mask of the present application may adopt quartz glass. Therefore, materials are obtained simply and conveniently. However, the carrier may also adopt other materials for bearing. For example, the carrier includes a metal film, namely, the carrier uses the metal film for bearing, and through holes used for light transmission are arranged in the metal film. The metal film plays a supporting role and bears the first light shading layer and the filtering layer, and the metal film has high strength and good bearing effect. In addition, the through holes are arranged in the metal film to facilitate light transmission.

Figure 7:
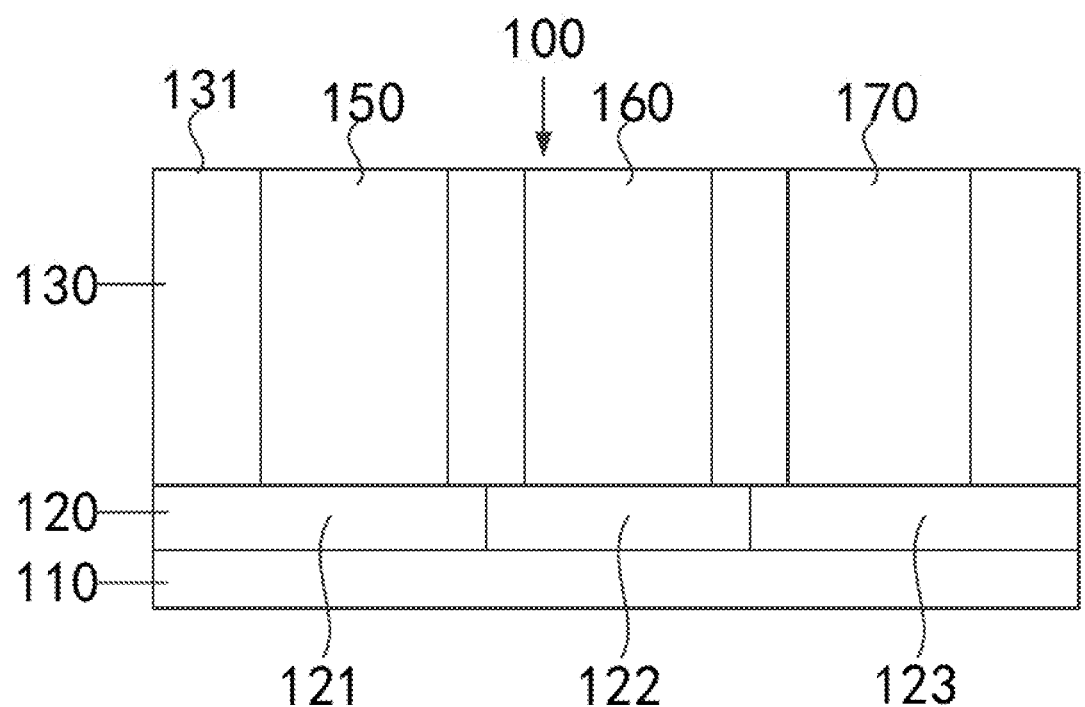
FIG. 7 is a structural schematic diagram of a mask of an embodiment of the present application.

In one or more embodiments of the present application, filling color filter are also arranged among the plurality of light shading blocks, have the same color as the corresponding color filters, are directly disposed on the light filtering portions and are located at the light filtering areas. Specifically, as shown in FIG. 7, a red filling color filter 150 is also arranged at the red light filtering area, and the red light filtering portion is located between the carrier and the red filling color filter. A green filling color filter 160 is also arranged at the green light filtering area, and the green light filtering portion is located between the carrier and the green filling color filter. A blue filling color filter 170 is also arranged at the blue light filtering area, and the green light filtering portion is located between the carrier and the blue filling color filter 170. In the present application, the filling color filter (the red/green/blue color filters) having a same photo-initiator as the color filter (the red/green/blue color filters) in the CF substrate are matched on the mask, so that the light filtering effect is better.

Figure 8:
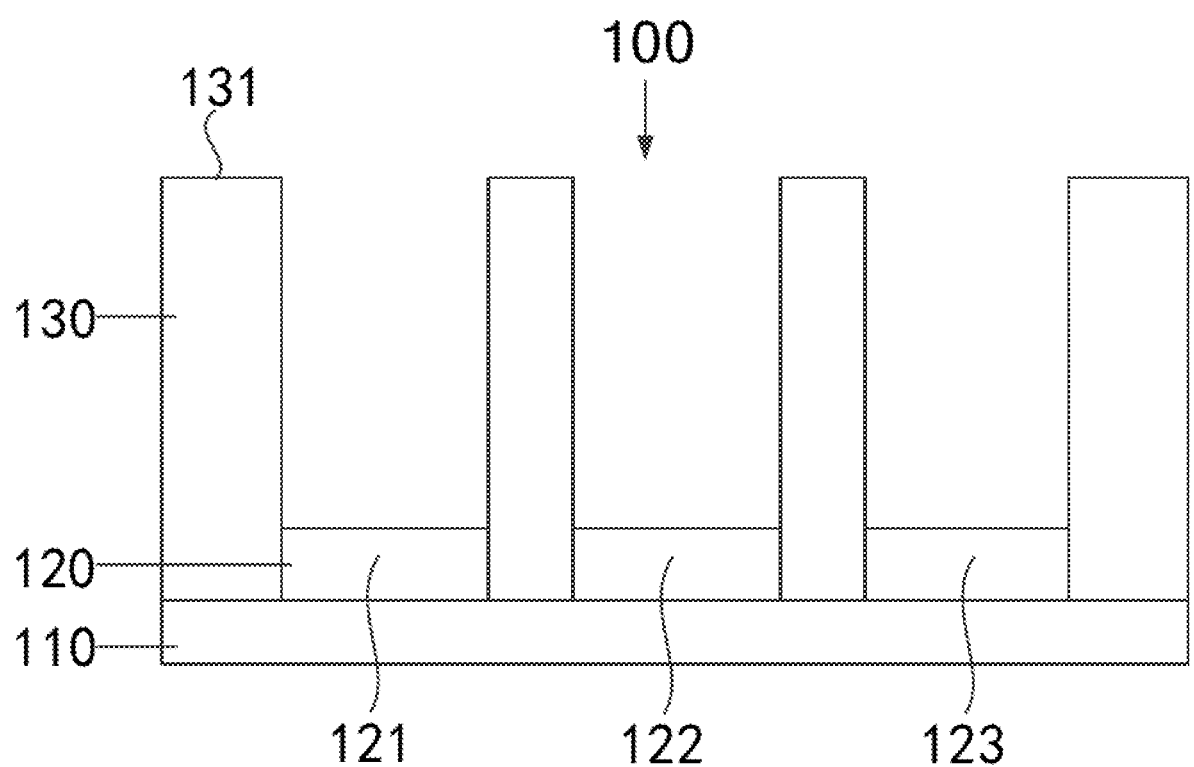
FIG. 8 is a structural schematic diagram of a mask of an embodiment of the present application.

In one or more embodiments of the present application, as shown in FIG. 8, the first light shading layer 130 may also be directly disposed on the carrier 110, and the filtering layer covers the bottoms of the three light filtering areas formed by the four light shading blocks respectively. Therefore, the first light shading layer and the light filtering layer are directly disposed on the carrier.

In one or more embodiments of the present application, each of the light filtering portions includes the metal grating or the transparent medium, or the metal gratings and the transparent media are stacked together to form the light filtering portions. An optional manner of embodiments of the present application is that the metal gratings are stacked on the transparent media to ensure that red/green/blue light filtering areas are overlapped with the transparent media, where the material of the metal grating may include nickel or other materials, and the material of the transparent medium may include polymethyl methacrylate (PMMA) or other materials. Of course, the transparent media may also be stacked on the metal gratings.

In one or more embodiments of the present application, the present embodiment discloses a manufacturing process of a display panel. The masks of above embodiments of the present application are adapted to the manufacturing process of the display panel, where the masks can refer to above embodiments and drawings, which are not described herein in detail one by one; and the manufacturing process of a display panel, including steps of:

forming the red color filter, where the light rays with the red wavelength pass through the red light filtering portion when the light rays with the red wavelength irradiate to the mask, the first light shading layer blocks the light rays with the red wavelength, and the green light filtering portion and the blue light filtering portion block the light rays with the red wavelength;

forming the green color filter, where the light rays with the green wavelength pass through the green light filtering portion when the light rays with the green wavelength irradiate to the mask, the first light shading layer blocks the light rays with the green wavelength, and the red light filtering portion and the blue light filtering portion block the light rays with the green wavelength;

forming the blue color filter, where the light rays with the blue wavelength pass through the blue light filtering portion when the light rays with the blue wavelength irradiate to the mask, the first light shading layer blocks the light rays with the blue wavelength, and the red light filtering portion and the green light filtering portion block the light rays with the blue wavelength.

In one or more embodiments of the present application, the present embodiment discloses a display, where the display includes the display panel produced in the above manufacturing process of the display panel, and a backlight module. The display may be an LCD or an OLED. The backlight module can be served as a light source for providing sufficient brightness and a uniformly distributed light source when the display of the present embodiment is the LCD, and the backlight module may be in a front light type or a backlight type. It should be noted that, the backlight module in the present embodiment is not limited thereto.

The above contents are detailed descriptions of the present application in combination with alternative embodiments. However, the concrete implementation of the present application shall not be considered to be only limited to these descriptions. For those ordinary skilled in the art to which the present application belongs, several simple deductions or replacements may be made without departing from the conception of the present application, all of which shall be considered to belong to the protection scope of the present application.

What is claimed is:

1. A mask adapted to a manufacturing process of a display panel, comprising:

a light filtering layer, comprising at least three light filtering portions for light rays with different wavelengths to pass through, wherein the at least three light filtering portions have a one-to-one correspondence to color filters in the display panel, and each of the light filtering portions is only used for the light rays with the wavelength having the same color as one of the color filters to pass through;

a first light shading layer, comprising a plurality of light shading blocks, the light shading blocks are spacedly arranged, and one light shading block is arranged at both ends of the light filtering portions respectively; and a carrier configured in a light-transmission way, wherein the light filtering layer and the first light shading layer are disposed on the carrier;

wherein each of the light filtering portion comprises a metal grating and a transparent medium used for light rays with a preset wavelength to pass through, and the metal gratings are stacked on the transparent media;

wherein the light filtering layer is directly disposed on the carrier, and the first light shading layer is directly disposed on the carrier, and the at least three light filtering portions are spacedly arranged among the plurality of light shading blocks; and filling color filters are also arranged among the plurality of light shading blocks, have a same color as the corresponding color filter and are directly disposed on the light filtering portions;

wherein the carrier comprises a metal film, and through holes used for light transmission are arranged in the metal film; and wherein the light filtering layer comprises a red light filtering portion only for light rays with a red wavelength to pass through, a green light filtering portion only for light rays with a green wavelength to pass through, and a blue light filtering portion only for light rays with a blue wavelength to pass through; and a number of light shading blocks is at least four, wherein the red light filtering portion, and the green light filtering portion and the blue light filtering portion are spacedly arranged among the four light shading blocks.

2. A mask adapted to a manufacturing process of a display panel, comprising
- a light filtering layer, comprising at least three light filtering portions for light rays with different wavelengths to pass through, wherein the at least three light filtering portions have a one-to-one correspondence to color filters in the display panel, and each of the light filtering portions is only used for the light rays with the wavelength having a same color as one of the color filters to pass through;
- a first light shading layer, comprising a plurality of light shading blocks, wherein the light shading blocks are spacedly arranged, and one light shading block is arranged at both ends of each of the light filtering portions respectively; and
- a carrier configured in a light-transmission way, wherein the light filtering layer and the first light shading layer are disposed on the carrier,
- wherein each of the light filtering portions comprises a metal grating for light rays with a reset wavelength to pass through.

3. The mask adapted to the manufacturing process of the display panel according to claim 2, wherein each of the light filtering portions comprises a transparent medium for light rays with a preset wavelength to pass through.

4. The mask adapted to the manufacturing process of the display panel according to claim 3, wherein the metal gratings are stacked on the transparent media.

5. The mask adapted to the manufacturing process of the display panel according to claim 3, wherein the transparent media are stacked on the metal gratings.

6. The mask adapted to the manufacturing process of the display panel according to claim 2, wherein the light filtering layer is directly disposed on the carrier, and the first light shading layer is directly disposed on the light filtering layer.

7. The mask adapted to the manufacturing process of the display panel according to claim 6, wherein filling color filters are also arranged among the plurality of light shading blocks, have a same color as the corresponding color filters and are directly disposed on the light filtering portions.

8. The mask adapted to the manufacturing process of the display panel according to claim 2, wherein the light filtering layer is directly disposed on the carrier, the first light shading layer is directly disposed on the carrier, and the at least three light filtering portions are spacedly arranged among the plurality of light shading blocks.

9. The mask adapted to the manufacturing process of the display panel according to claim 8, wherein filling color filters are also arranged among the plurality of light shading blocks, have the same color as the corresponding color filters and are directly disposed on the light filtering portions.

10. The mask adapted to the manufacturing process of the display panel according to claim 2, wherein the carrier comprises a light-transmission glass substrate.

11. The mask adapted to the manufacturing process of the display panel according to claim 2, wherein the carrier comprises a metal film, and through holes used for light transmission are disposed on the metal film.

12. The mask adapted to the manufacturing process of the display panel according to claim 2, wherein the light filtering layer comprises a red light filtering portion only for light rays with a red wavelength to pass through, a green light filtering portion only for light rays with a green wavelength to pass through, and a blue light filtering portion only for light rays with a blue wavelength to pass through;
- wherein at least four light shading blocks are arranged, and the red light filtering portion, the green light filtering portion and the blue light filtering portion are spacedly arranged among the four light shading blocks.

13. The mask adapted to the manufacturing process of display panel according to claim 12, wherein the red light filtering portion comprises a red transparent medium, the green light filtering portion comprises a green transparent medium, and the blue light filtering portion comprises a blue transparent medium.

14. The mask adapted to the manufacturing process of display panel according to claim 12, wherein, the red light filtering portion includes a red metal grating, the green light filtering portion includes a green metal grating, and the blue light filtering portion includes a blue metal grating.

15. The mask adapted to the manufacturing process of display panel according to claim 12, wherein a red light filtering region, a green light filtering region and a blue light filtering region are formed between the four light shielding blocks; the red light filtering region is further provided with a red filling color filter, the red light filtering is located between the carrier and the red filling color filter; the green light filtering region is further provided with a green filling color filter, the green light filtering being located between the carrier and the green filling color filter; the blue light filtering region is also provided with a blue filling color filter, the blue light filtering being located between the carrier and the blue filling color filter.

16. The mask adapted to the manufacturing process of the display panel according to claim 2, wherein the light filtering layer comprises a red light filtering portion only for light rays with a red wavelength to pass through, a green light filtering portion only for light rays with a green wavelength to pass through, a blue light filtering portion only for light rays with a blue wavelength to pass through, and a white light filtering portion only for light rays with a white wavelength to pass through;
- wherein five light shading blocks are arranged, and the red light filtering portion, the green light filtering portion, the blue light filtering portion and the white light filtering portion are spacedly arranged among the five light shading blocks.

17. The mask adapted to the manufacturing process of the display panel according to claim 2, wherein the light filtering layer comprises a red light filtering portion only for light rays with a red wavelength to pass through, a green light filtering portion only for light rays with a green wavelength to pass through, a blue light filtering portion only for light rays with a blue wavelength to pass through, and a yellow light filtering portion only for light rays with a yellow wavelength to pass through; and
- wherein five light shading blocks are arranged, and the red light filtering portion, the green light filtering portion, the blue light filtering portion and the yellow light filtering portion are spacedly arranged among the five light shading blocks.

18. A mask adapted to a manufacturing process of a display panel, comprising
- a light filtering layer, comprising at least three light filtering portions for light rays with different wavelengths to pass through, wherein the at least three light filtering portions have a one-to-one correspondence to color filters in the display panel, and each of the light filtering portions is only used for the light rays with the wavelength having a same color as one of the color filters to pass through;

a first light shading layer, comprising a plurality of light shading blocks, wherein the light shading blocks are spacedly arranged, and one light shading block is arranged at both ends of each of the light filtering portions respectively; and a carrier configured in a light-transmission way, wherein the light filtering layer and the first light shading layer are disposed on the carrier, wherein the carrier comprises a metal film, and through holes used for light transmission are disposed on the metal film.

\* \* \* \* \*